United States Patent
Levin et al.

(10) Patent No.: US 10,665,319 B1
(45) Date of Patent: May 26, 2020

(54) MEMORY DEVICE TESTING

(71) Applicant: Amazon Technologies, Inc., Reno, NV (US)

(72) Inventors: Alex Levin, Santa Clara, CA (US); Ron Diamant, Albany, CA (US); Georgy Zorik Machulsky, San Jose, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 70 days.

(21) Appl. No.: 16/137,187

(22) Filed: Sep. 20, 2018

(51) Int. Cl.
*G11C 29/42* (2006.01)
*G06F 11/10* (2006.01)
*G11C 29/52* (2006.01)

(52) U.S. Cl.
CPC .......... *G11C 29/42* (2013.01); *G06F 11/1068* (2013.01); *G11C 29/52* (2013.01)

(58) Field of Classification Search
CPC ...... G11C 29/42; G11C 29/52; G06F 11/1068
See application file for complete search history.

(56) References Cited

U.S. PATENT DOCUMENTS

| | | | | |
|---|---|---|---|---|
| 5,455,834 A * | 10/1995 | Chang | ................. | G06F 11/1008 714/5.11 |
| 6,360,344 B1 * | 3/2002 | Khoche | .......... | G01R 31/318544 714/733 |
| 6,374,387 B1 * | 4/2002 | van den Berghe | ... | H03M 13/23 714/790 |
| 2004/0064715 A1 * | 4/2004 | Kaminaga | ........... | G06F 9/30043 713/193 |
| 2006/0061795 A1 * | 3/2006 | Walmsley | ................ | G06F 21/73 358/1.14 |
| 2006/0143454 A1 * | 6/2006 | Walmsley | ................ | G06F 21/85 713/170 |
| 2006/0146622 A1 * | 7/2006 | Mukherjee | ........ | G01R 31/31724 365/201 |
| 2006/0181558 A1 * | 8/2006 | Walmsley | ............. | B41J 2/04541 347/12 |
| 2006/0187251 A1 * | 8/2006 | Pulver | ................... | B41J 2/04505 347/13 |

(Continued)

OTHER PUBLICATIONS

Pradhan, D.K., et al., "A Hamming Distance Based Test Pattern Generator with Improved Fault Coverage," Proceedings of the 11th IEEE International On-Line Testing Symposium (IOLTS'05), Conference Location: French Riviera, France, Date of Conference: Jul. 6-8, 2005, pp. 1-6. (Year: 2005).*

*Primary Examiner* — Kyle Vallecillo

(74) *Attorney, Agent, or Firm* — Hogan Lovells US LLP

(57) ABSTRACT

Approaches for testing memory devices, such as DRAMs, are described that can quickly identify various potential storage issues. The memory space for a device can be divided into subspaces that can be tested concurrently. A starting address is determined for each memory sub-space, and addresses are identified that are within a Hamming distance of the starting address, where a single Hamming distance or multiple Hamming distances can be used. Once a list of addresses is generated, a test pattern can be written to, and read from, the corresponding addresses. Differences from the expected pattern can be indicative of problems with the memory device, whether before user deployment or while storing live data. If there are specific problems suspected, targeted testing can be utilized that does not test the entirety of the memory space.

20 Claims, 5 Drawing Sheets

(56) References Cited

U.S. PATENT DOCUMENTS

| | | | |
|---|---|---|---|
| 2006/0274112 A1* | 12/2006 | Jackson Pulver | B41J 2/04505 347/42 |
| 2007/0019016 A1* | 1/2007 | Silverbrook | G06K 15/102 347/13 |
| 2007/0083491 A1* | 4/2007 | Walmsley | G06F 21/608 |
| 2009/0030624 A1* | 1/2009 | He | G01R 31/31703 702/60 |
| 2012/0060058 A1* | 3/2012 | Prakash | G11C 29/50 714/30 |
| 2013/0002638 A1* | 1/2013 | Missbach | G02B 30/00 345/211 |
| 2014/0344292 A1* | 11/2014 | Friedlander | G06F 16/248 707/752 |
| 2014/0344548 A1* | 11/2014 | Friedlander | G06F 12/1018 711/206 |
| 2015/0113247 A1* | 4/2015 | Escalona | G06F 9/30156 712/42 |
| 2017/0091344 A1* | 3/2017 | Adams | G06F 16/90339 |

* cited by examiner

MEMORY DEVICE TESTING

BACKGROUND

As an ever-increasing amount of important data is being stored electronically, there is a corresponding need to improve the processes by which various memory and storage devices are tested. As an example, DRAM is a type of memory where each bit of information is represented by a capacitor that can be either charged or discharged for respective values of 0 or 1. The electric charge on the capacitors can leak over time. In order to address this potential leakage, a memory refresh circuit periodically rewrites the data in the capacitors. Due to the electrical nature of lines that lead to these capacitors, as well as the way in which the memory device is designed, various errors can still result. In order to prevent these errors or attacks that exploit these errors, as well as the subsequent loss of data that results, the memory devices can be tested. Conventional testing approaches either take too long to execute to be practical, or are not as accurate as might otherwise be desired.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Approaches in accordance with various embodiments provide for the testing of various memory devices. In particular, various embodiments provide for testing memory devices, such as DRAMs, using approaches that can quickly identify issues with the devices with high accuracy. In one embodiment, the memory space to be tested can be divided into subspaces that can be tested concurrently. A starting address is determined for each memory sub-space, and addresses are identified that are within a Hamming distance of the starting address, where a single Hamming distance or multiple Hamming distances can be used. Once a list of addresses is generated, a test pattern can be written to, and read from, the corresponding addresses to determine whether the read pattern matches the expected pattern. Differences from the expected pattern can be indicative of problems with the memory device, whether before user deployment or while storing live data. If there are specific problems suspected, targeted testing can be utilized that does not test the entirety of the memory space.

Various other functions can be implemented within the various embodiments as well as discussed and suggested elsewhere herein.

Figure 1:
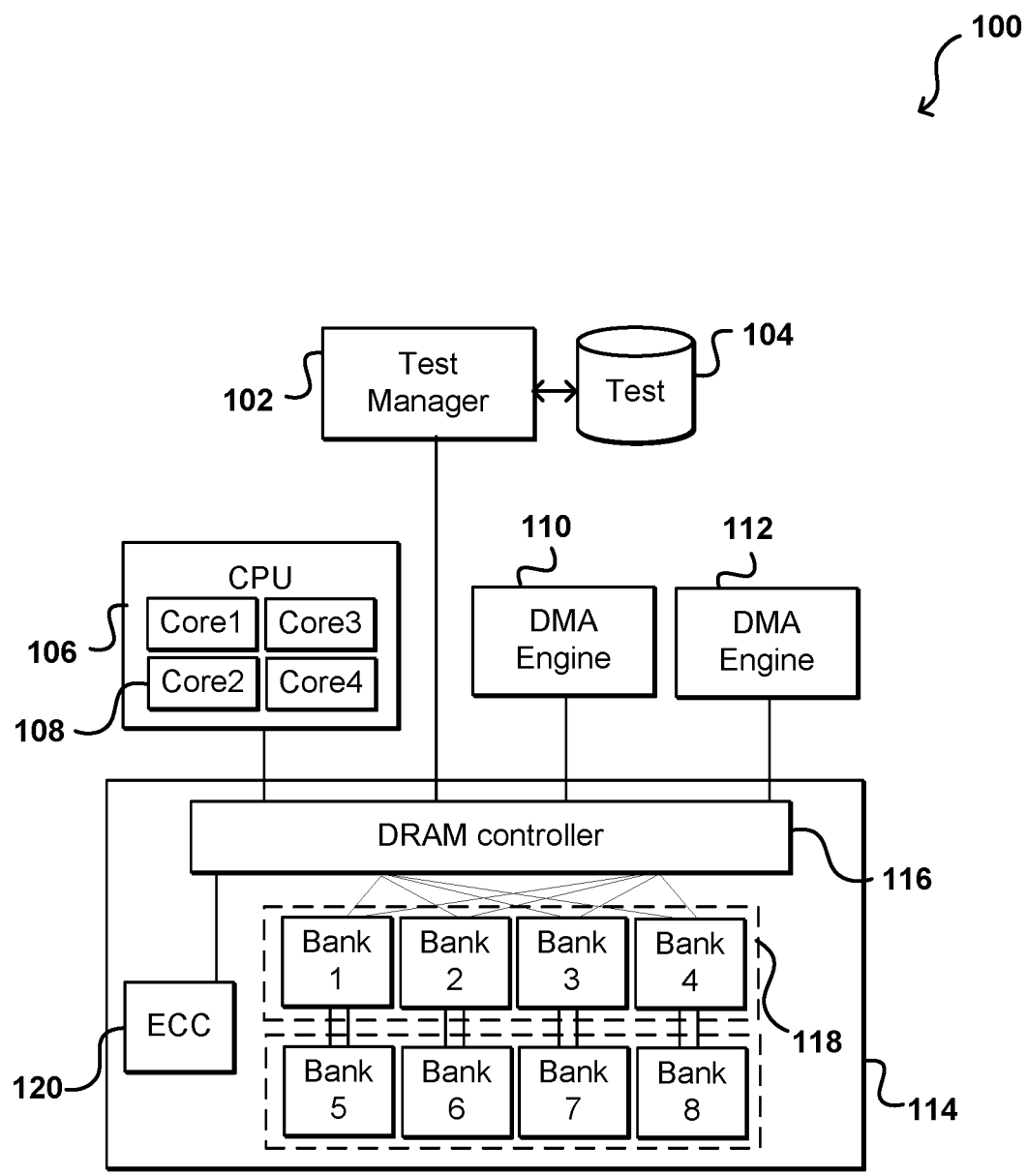
FIG. 1 illustrates components of an example testing system that can be utilized in accordance with various embodiments.

FIG. 1 illustrates an example testing system architecture 100 that can be utilized in accordance with various embodiments. A memory device is to be tested to detect the presence of certain types of errors. The memory device in this example is a dynamic random-access memory (DRAM) device, although other random-access memories or other types of memory or storage devices can take advantage of testing approaches as well within the scope of the various embodiments, as would be apparent to one or ordinary skill in the art in light of the teachings and suggestions contained herein. The DRAM device 114 in this example includes a DRAM controller 116 and a pair of memory ranks 118, with each rank including four memory banks. An error-correcting code (ECC) memory device is included in the DRAM device as well. There may be various other components and arrangements used as well for other memory device designs and topologies.

As known for such memory devices, DRAM memory enables bits of data to be stored without a continual supply of power to maintain the charge. The DRAM can store multiple words, which are each stored using multiple memory cells, with each memory cell each storing one bit of data. The data is written and read using a pattern of data lines connected to rows and/or columns of cells. In a DRAM memory, a capacitor and a transistor, such as a metal oxide semiconductor (MOS) transistor, are used to store the bit data in a given memory cell. As mentioned, the charge on the capacitor can leak over time, in some cases to a neighboring line or capacitor, such that the charge is typically refreshed over time. In order to have a memory cell store a bit value of 1, a specified electric charge would be applied to the capacitor for that cell, and the charge needs to be maintained at least at a minimum value, or above a specified charge threshold in order to represent the bit value of 1. To cause the memory cell to store, or represent, a bit value of 0, any charge on the cell can be discharged, such that the memory cell has a near-zero charge that is at least below a specified charge threshold, which may be different from the threshold for a bit value of 1.

As mentioned, the charge on the capacitor can be refreshed periodically (e.g., every 40 or 80 nanoseconds) in order to prevent excessive charge leak or otherwise cause the charge to be reduced (or increased) to a level that no longer represents the appropriate bit value. In some embodiments an external refresh circuit can be used to periodically rewrite the data stored in the various capacitors. Due in part to the electrical nature of the components and the design of various memory devices, however, there are a number of errors or issues that may occur.

As a first example, there may be timing violations experienced on an address bus of the memory device. Memory device access can have strict timing constraints that are dictated by the manufacturer. These constraints can correspond to the time periods needed for specific memory operations to occur in a worst-case scenario. In the case of a column address strobe, the address inputs are captured on the falling edge and a column is selected. A violation of these timing constrains will result in various faults, such as may include corruption of data and/or memory for both reach and write operations.

There may also be issues with data retention on various memory cells over time. As mentioned, each bit that is set to a value of 1 corresponds to a capacitor that is charged and needs to be periodically recharged or refreshed. A refresh cycle constraint is a parameter that dictates how often these recharges occur. In many cases, even a short enough refresh cycle that meets the demand of the manufacturer can result in a leakage of current, as may result to the proximity of the rows and columns in the design. A small amount of current leakage between cells in close physical proximity can result in one or more bit flips for the relevant cells. Such issues can also be exploited through various types of security attacks, such as a row hammer attack. A row hammer attack can involve the intentional flipping of bits in order to attack the kernel, leading to page tables of the kernel being accessible by the attacker.

Other types of attacks or exploits can occur as well, as may relate to the decoding of rows, columns, banks, or ranks as discussed herein. Due to factors such as physical deterioration of components of a memory device over time, decoding errors can occur where one or more bit flips office on the address lines, where physical deterioration can lead to a leak of charge, improper charging, inability to properly direct charge, etc.

Approaches in accordance with various embodiments attempt to provide an exhaustive test suite that can be used to assure that a given memory device (e.g., DRAM) implementation is not exposed or susceptible to these and other such problems. Such approaches can be critical for pre-screening hardware designs in at least some embodiments, in order to determine physical defects and attack vectors in devices before those devices are placed in use with live data. Such approaches can also help to identify manufacturing errors and bin the devices accordingly.

In one embodiment, a test can be used to attempt to stress some or all lines in a given memory device. Such a test can involve data and address lines in a device such as a DRAM. Such an approach can help to identify one or more problems that may occur on the device that manifest themselves as a result of the stress. In at least some embodiments, stress can be created or produced by draining and applying charge on specific capacitors and determining the occurrence of bit flips on the device. In FIG. 1, such a test can be carried out or executed using a test manager 102. The test manager can be a server, system, processor, device, process, or service, which can be provided by a party owning or producing the memory device to be tested, or by a third party. The test manager 102 can utilize various testing data stored to a test repository 104, as may include information about past failures or results that may be beneficial in testing. The test data can also include patterns to use or specific areas for testing, among other such options. The testing data can also include results of various tests as discussed herein.

In various embodiments the testing can be carried out using various components that are able to access the memory space in the DRAM. These components can include, for example, processor cores, direct memory access (DMA) engines, memory controllers, staggered pin grid array (SPGA) devices, and the like. In the example architecture 100 of FIG. 1, there are four processor cores 108 of a central processing unit (CPU) 106 and two DMA engines 110, 112 that can each be used for testing the memory device 114. Accordingly, the memory space for the memory device 114 can be divided into six sub-spaces, each of which can be tested using a different testing component. While in some embodiments attempts will be made to make the subspaces as even in size as possible, in other embodiments the sizes of the sub-spaces may differ, as may relate to the different capacities of the components doing the testing, among other such options. Such an approach can be used to concurrently access multiple regions of the memory space while taking advantage of the additional processing capacity of multiple components.

Figure 2:
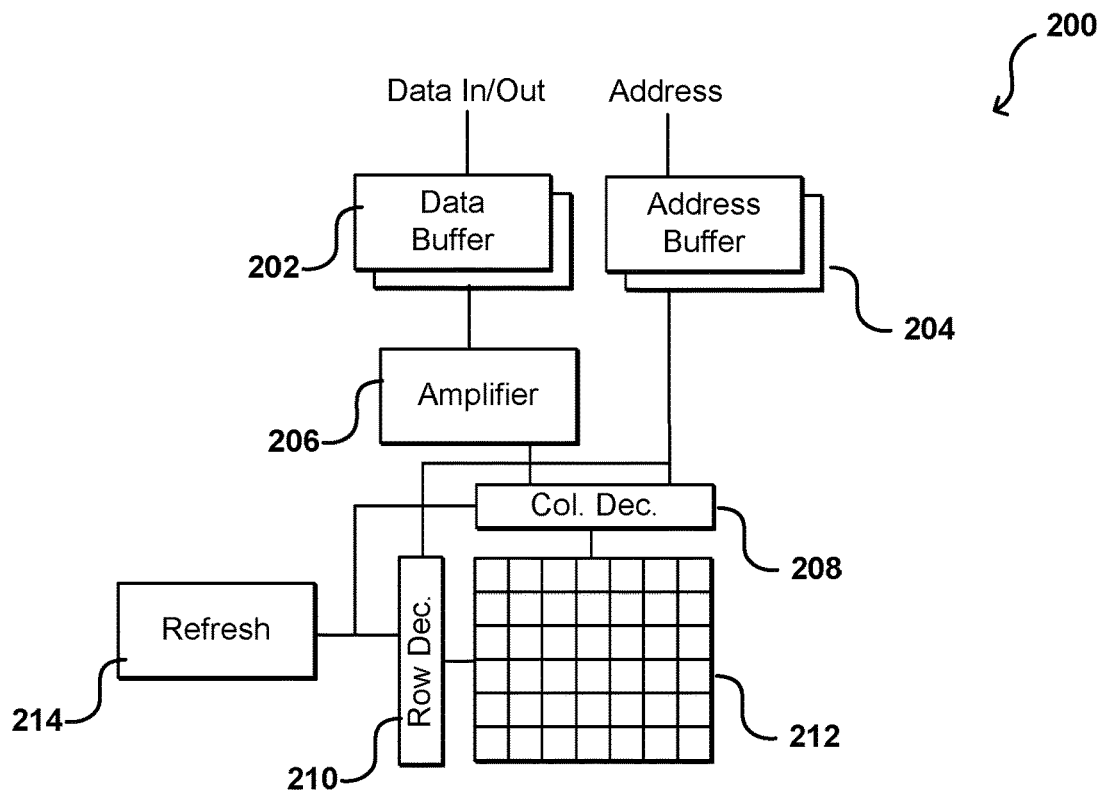
FIG. 2 illustrates an example memory device layout that can be utilized in accordance with various embodiments.
Figure 3:
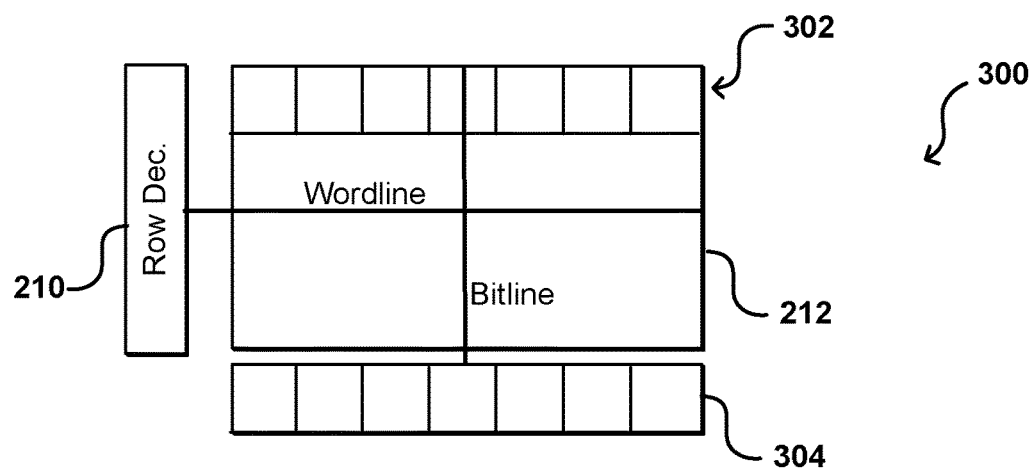
FIG. 3 illustrates another example memory device layout that can be utilized in accordance with various embodiments.

FIGS. 2 and 3 illustrate designs of example memory devices that can be tested in accordance with various embodiments. As mentioned, this is only for explanation purposes and there are many other designs and types of memory devices that can be tested or processed as well within the scope of the various embodiments. The example design 200 of FIG. 2 shows a row and column design of a conventional DRAM device. In this example data is received to a data buffer 202 for both data to be written to, and data read from, the cells of the memory device 212. There is also an address buffer 204 for receiving address information for the cells. The information from the respective buffers can be transmitted to, and from, the cells through at least one column decoder 208 and at least one row decoder 210. The data to be written in this example passes through at least one amplifier in order to ensure that sufficient charge is written to the respective capacitor. As mentioned, a refresh component 214 or circuit can periodically refresh or rewrite the data to the various cells of the device 212. The address bus in this example is multiplexed between row and column components, and the row and column addresses can be strobed or latched in sequentially. The refresh component 214, which can be internal or external to the DRAM device, can periodically strobe consecutive memory addresses in order to refresh the various cells. The refreshing of a cell will generally occur outside periods of read or write operations in order to avoid data storage or retrieval errors resulting from the refresh operation.

The example design 300 of FIG. 3 illustrates a layout of a memory bank, such as may be used for the design of a DRAM device 212. The design in this example is that of a two-dimensional memory array, including both rows 302 and columns of memory cells as discussed above. Each row can have cells for multiple columns, with each bank also having a row buffer 304 as discussed above. The row buffer can include a series of amplifiers to function as latches. A number of bitlines are positioned across a given bank of memory cells along the columns, which connect the amplifiers to the cells in the same column. Wordlines for each row determine which row of cells is connected to those respective bitlines. In various designs a wide data bus can be used to connect to each memory bank within a rank, and a dedicated address bus can carry row and column addresses to the various memory devices. Both address and control buses can connect the memory device controller to the various memory banks. When a memory command is received, the command is typically transported through the address and command buses and decoded, with data then being moved from the cells to the amplifiers or back from the amplifiers to the cells. The data can then be moved through an appropriate gating circuit and placed onto the data bus for a read or write command. Various other designs and topologies can be used as well within the scope of the various embodiments.

Figure 4:
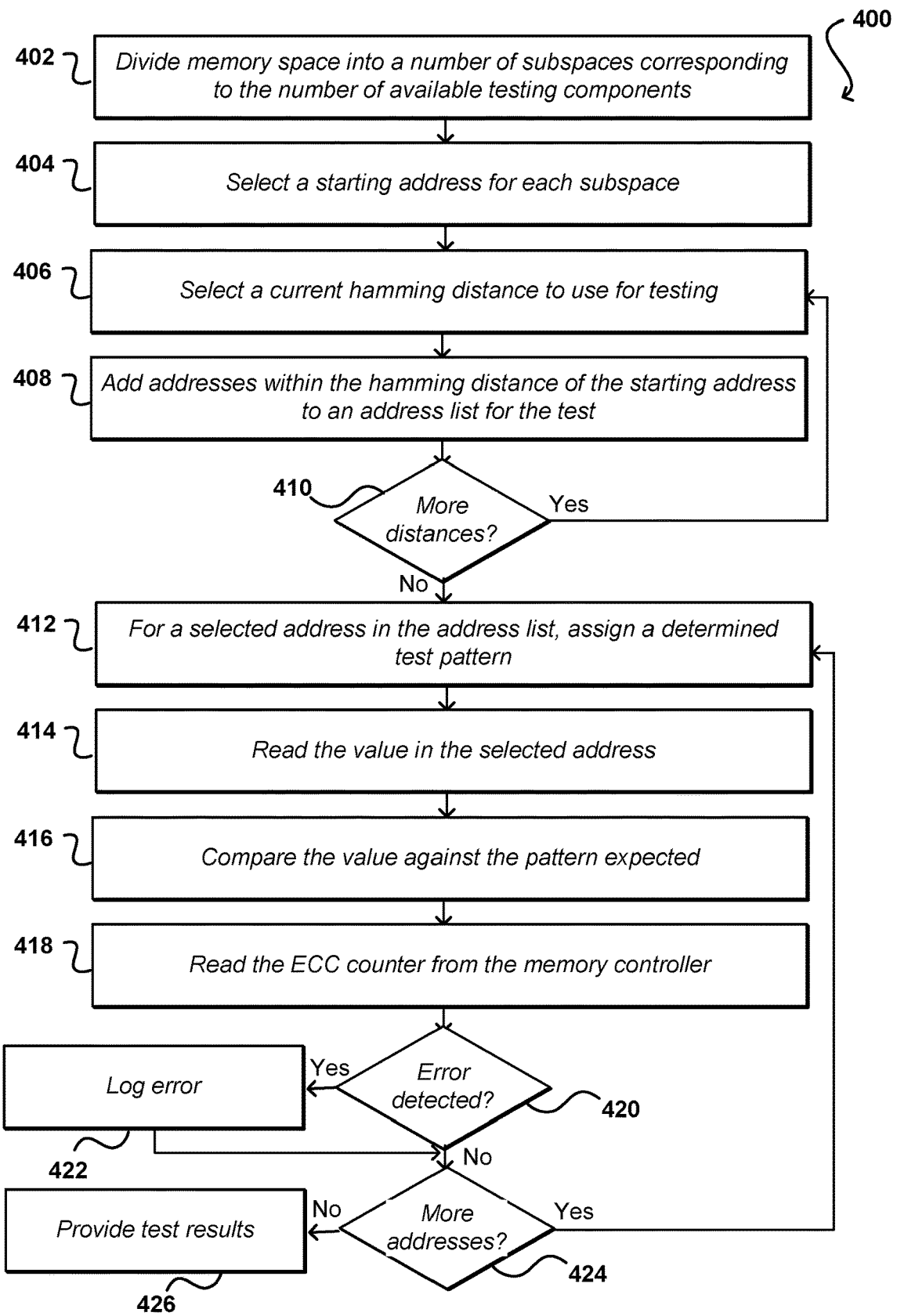
FIG. 4 illustrates an example process for testing a memory device that can be utilized in accordance with various embodiments.

A testing algorithm can utilize such a design to determine one or more optimal testing patterns or approaches. FIG. 4 illustrates an example process 400 for testing a memory device that can be utilized in accordance with one embodiment. It should be understood for this and other processes discussed herein that there can be additional, alternative, or fewer steps performed in similar or alternative orders, or in parallel, within the scope of the various embodiments unless otherwise stated. Further, although this example is directed toward a design useful for a RAM device such as a DRAM, it should be understood that other types of memory and storage devices can benefit from advantages of the various embodiments as well. In this example, the memory device to be tested is selected. A device may be selected for any of a number of reasons, such as for initial testing of a new device before that device is sent to a user (e.g., a customer) or deployed for storing live data. A device may also be tested as part of a scheduled testing procedure, or in response to potential failure detection, among other such options. In this example, the memory space for the device is divided 402 or otherwise apportioned into a number of subspaces corresponding to the number of testing components available, or at least selected, to be used for the testing. As mentioned, these devices can include CPU cores, DMA engines, and the like.

As mentioned, each of the subspaces can be tested concurrently, or in parallel, in order to reduce testing time for a given device. As mentioned, however, in some situations only one or a subset of the subspaces may be tested, or a limited address range of those subspaces, among other such options. For each subspace being tested, a starting address can be selected 404. The starting address may be selected at random from the address range of the memory subspace, or can be selected manually or from a testing algorithm, such as where there may be a suspicious address, row, or column to be inspected. For some designs there may be certain addresses or subspaces that are more susceptible to errors, and the starting addresses may be selected at least in part to attempt to identify those specific errors.

For each respective subspace, the current Hamming distance can be selected 406. As mentioned, in many embodiments Hamming distances of (1,2) or (1,2,3) will most likely be used, although larger Hamming distances or other groups of Hamming distances can be used as discussed herein. In this example the Hamming distance will likely start at 1, then go to 2, then go to 3 in many embodiments. For the current Hamming distance, addresses will be determined that are within the Hamming distance of the determined start address. If the maximum number of addresses is reached then the process can stop in at least some embodiments. Each identified address can then be added to an address list for the test, or for the respective subspace for the test. As mentioned elsewhere herein, however, the Hamming distance can be used for data pattern testing in addition to address testing in at least some embodiments.

A Hamming distance generally refers to the number of positions at which the bit values are different for two strings of equal length, such as two codewords of equal length stored in memory space. The Hamming distance thus can refer to a minimum number of bit flips or changes required to change one string into the other, whether the flips are intentional or through error or attack, etc. The Hamming distance between two integers stored to memory space is the number of positions at which the corresponding bits are different. As an example, the strings:

1<u>0</u>01001
1<u>1</u>01001 would have a Hamming distance of 1, for having one different bit value, while the strings:

1<u>00</u>1001
1<u>11</u>1001 would have a Hamming distance of 2, as two bits would need to be flipped to go from one string to the other. For a string of eight bits, there would then be eight strings that satisfy a Hamming distance of 1, where each string has a different bit position flipped. This process can continue until all addresses satisfying the Hamming distance have been identified or the list has reached its maximum length. A determination can then be made 410 as to whether there are more Hamming distances to be tested, assuming the address list has not reached any maximum length. If so, the Hamming distance can be incremented (or otherwise updated to the next distance to be used) and process can continue. As mentioned, an address list based on Hamming distances can create a significant amount of noise since for each transition of address there will be a change in address lines.

Once all addresses have been identified for the Hamming distances, or the address list has reached a maximum length, the testing for those addresses can begin. It should be noted, however, that in other embodiments the testing can begin as soon as at least one such address is identified for a given subspace. For each address in the list, or at least a subset of addresses in various embodiments, a testing pattern can be assigned. These patterns can be any appropriate memory testing patterns or sequences, as may include 0x5555, 0xaaaa, walking ones, walking zeroes, and the like. For a walking one test pattern, one data line at a time is set to a value of 1 with all others set to 0. For each test cycle a full word is written and read back, and if the data is identical then the test proceeds to the next data line and repeats until all data lines have been tested. A walking zero pattern is similar to a walking one, except that the data line being tested is set to a value of 0 and all the others are set to 1. Various other testing approaches can be used as well as discussed and suggested elsewhere herein. For the selected address, the appropriate pattern can be assigned 412 and written as discussed, with the value then being read 414 for the selected address. The value read can be compared 416 against the pattern expected. In this example the corresponding data from the error-correcting code (ECC) memory counter can also be read from the memory controller, if supported. As mentioned, the ECC memory can detect single bit errors stored to the memory device. An ECC-capable memory controller can detect (and in some cases correct) for errors of a single bit per 64-bit word, or other unit of bus transfer. If the pattern read is as expected, and it is determined 420 that no error is detected, then if it is determined 424 that there are more addresses then the test can move to the next address (at least for the same sub-space) and testing can continue. It should be noted that in some embodiments the detection of a single error, or more than a maximum allowable or threshold number of errors, can cause testing to be terminated for the device and the device determined to have failed the test. In this example, if an error is detected then it is logged 422 or otherwise saved as test result data. If the testing process completes and there are no more addresses to be tested, the test results can be processed, aggregated, stored, or otherwise provided 426 or made available for review or analysis. As mentioned, in some embodiments a test failure will result in at least one remedial action being taken, such as to cause a deployed memory device to be removed from service or prevent a new device from being deployed, etc. In some embodiments there might be an allowable number or type of error, and a device is considered to fail the test only if having more than the allowable number of errors or a specific type of error. In some embodiments, however, the number of allowable errors may be zero. As an example, a DRAM device having two errors might be logged as problematic, but a DRAM device having ten or more errors might be removed from usage. For a device storing active data, this can involve moving the data (or replicating from another source) and removing the storage device from use once the data is secure.

As mentioned, the use of a Hamming distances for testing can create significant stress on the address lines and on the individual memory DRAM cells, as there is a high probability that the testing will hit neighboring rows, columns, banks, and/or ranks of the device due to the creation of bit-flips on physically adjacent lines. Such an approach can then hit all addressing lines in memory space. As mentioned, patterns can also be selected in such a way as to create as many bit-flips as possible on the data lines. The process of reading and comparing the data can help to ensure that errors are detected, and single bit flips will be caught by the ECC counter, at least where supported in the memory controller. Such an approach can reduce the hours needed to test a single device using conventional approaches down to a number of seconds with similar, if not greater, accuracy. Such approaches can be used for various topologies of DRAM, as well as other types of memory device, including but not limited to double data rate (DDR) DRAM, as well as subsequent releases DDR2 and DDR3.

There also can be targeted testing in at least some embodiments. For example, there may be a specific bank or subspace that is suspected to have an error. In such cases the testing may be targeted and/or limited to that area or region. This may also impact the choice of pattern, starting address, or range of Hamming distances used, depending at least in part upon a type or seriousness of the suspected issue or error. Further, some designs may be more susceptible to errors, such as where longer lanes may be more susceptible to cross-talk.

Figure 5:
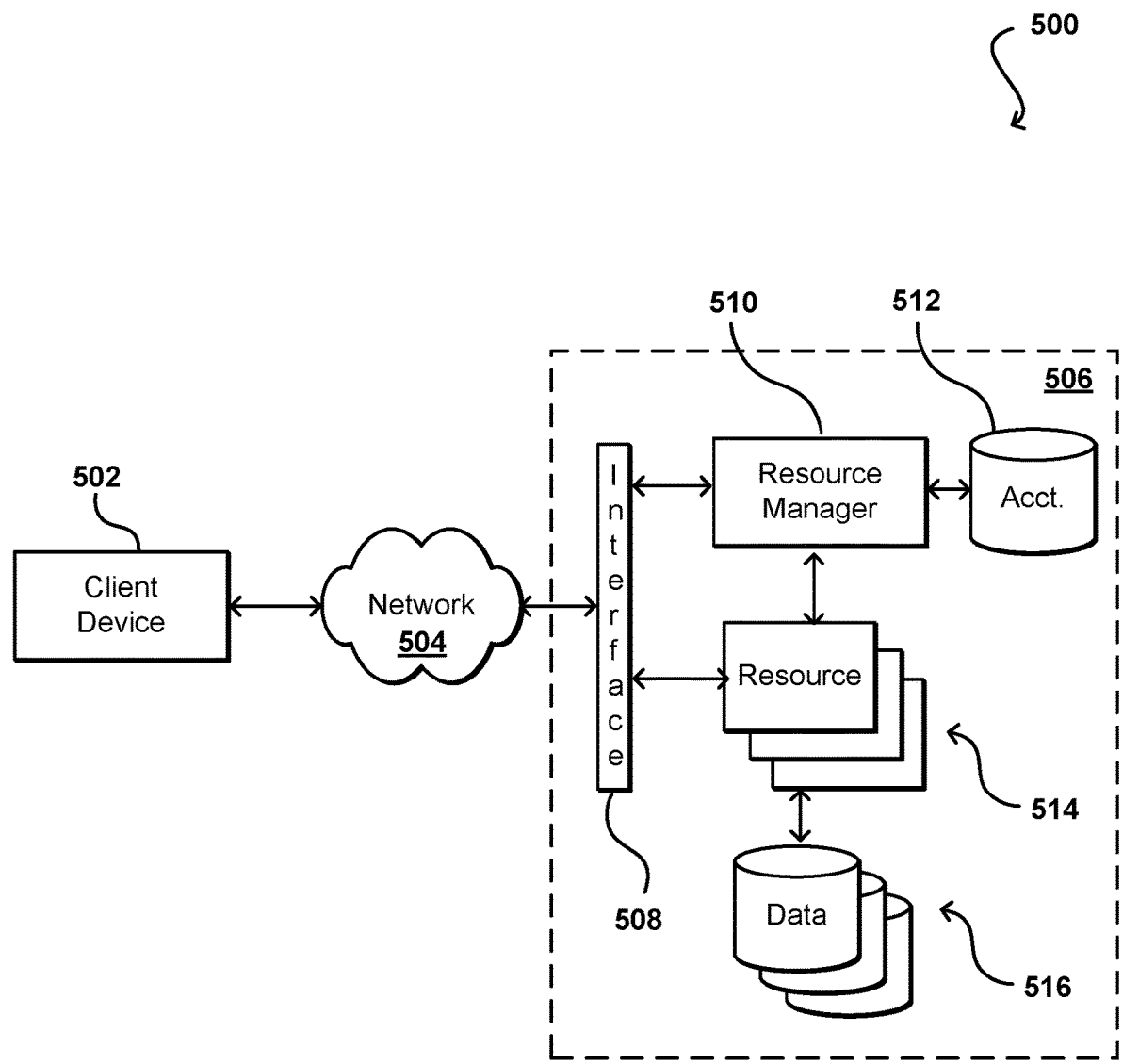
FIG. 5 illustrates an example environment in which various embodiments can be implemented.

FIG. 5 illustrates an example environment 500 in which aspects of the various embodiments can be implemented. For example, the environment might represent a data center where a number of computing resources 514 utilize memory devices such as DRAM devices as discussed herein. In this example a user is able to utilize a client device 502 to submit requests across at least one network 504 to a multi-tenant resource provider environment 506. The client device can include any appropriate electronic device operable to send and receive requests, messages, or other such information over an appropriate network and convey information back to a user of the device. Examples of such client devices include personal computers, tablet computers, smart phones, notebook computers, and the like. The at least one network 504 can include any appropriate network, including an intranet, the Internet, a cellular network, a local area network (LAN), or any other such network or combination, and communication over the network can be enabled via wired and/or wireless connections. The resource provider environment 506 can include any appropriate components for receiving requests and returning information or performing actions in response to those requests. As an example, the provider environment might include Web servers and/or application servers for receiving and processing requests, then returning data, Web pages, video, audio, or other such content or information in response to the request.

In various embodiments, the provider environment may include various types of resources that can be utilized by multiple users for a variety of different purposes. As used herein, computing and other electronic resources utilized in a network environment can be referred to as "network resources." These can include, for example, servers, databases, load balancers, routers, and the like, which can perform tasks such as to receive, transmit, and/or process data and/or executable instructions. In at least some embodiments, all or a portion of a given resource or set of resources might be allocated to a particular user or allocated for a particular task, for at least a determined period of time. The sharing of these multi-tenant resources from a provider environment is often referred to as resource sharing, Web services, or "cloud computing," among other such terms and depending upon the specific environment and/or implementation. In this example the provider environment includes a plurality of resources 514 of one or more types. These types can include, for example, application servers operable to process instructions provided by a user or database servers operable to process data stored in one or more data stores 516 in response to a user request. As known for such purposes, the user can also reserve at least a portion of the data storage in a given data store. Methods for enabling a user to reserve various resources and resource instances are well known in the art, such that detailed description of the entire process, and explanation of all possible components, will not be discussed in detail herein.

In at least some embodiments, a user wanting to utilize a portion of the resources 514 can submit a request that is received to an interface layer 508 of the provider environment 506. The interface layer can include application programming interfaces (APIs) or other exposed interfaces enabling a user to submit requests to the provider environment. The interface layer 508 in this example can also include other components as well, such as at least one Web server, routing components, load balancers, and the like. When a request to provision a resource is received to the interface layer 508, information for the request can be directed to a resource manager 510 or other such system, service, or component configured to manage user accounts and information, resource provisioning and usage, and other such aspects. A resource manager 510 receiving the request can perform tasks such as to authenticate an identity of the user submitting the request, as well as to determine whether that user has an existing account with the resource provider, where the account data may be stored in at least one data store 512 in the provider environment. A user can provide any of various types of credentials in order to authenticate an identity of the user to the provider. These credentials can include, for example, a username and password pair, biometric data, a digital signature, or other such information. The provider can validate this information against information stored for the user. If the user has an account with the appropriate permissions, status, etc., the resource manager can determine whether there are adequate resources available to suit the user's request, and if so can provision the resources or otherwise grant access to the corresponding portion of those resources for use by the user for an amount specified by the request. This amount can include, for example, capacity to process a single request or perform a single task, a specified period of time, or a recurring/renewable period, among other such values. If the user does not have a valid account with the provider, the user account does not enable access to the type of resources specified in the request, or another such reason is preventing the user from obtaining access to such resources, a communication can be sent to the user to enable the user to create or modify an account, or change the resources specified in the request, among other such options.

Once the user is authenticated, the account verified, and the resources allocated, the user can utilize the allocated resource(s) for the specified capacity, amount of data transfer, period of time, or other such value. In at least some embodiments, a user might provide a session token or other such credentials with subsequent requests in order to enable those requests to be processed on that user session. The user can receive a resource identifier, specific address, or other such information that can enable the client device 502 to communicate with an allocated resource without having to communicate with the resource manager 510, at least until such time as a relevant aspect of the user account changes, the user is no longer granted access to the resource, or another such aspect changes.

The resource manager 510 (or another such system or service) in this example can also function as a virtual layer of hardware and software components that handles control functions in addition to management actions, as may include provisioning, scaling, replication, etc. The resource manager can utilize dedicated APIs in the interface layer 508, where each API can be provided to receive requests for at least one specific action to be performed with respect to the data environment, such as to provision, scale, clone, or hibernate an instance. Upon receiving a request to one of the APIs, a Web services portion of the interface layer can parse or otherwise analyze the request to determine the steps or actions needed to act on or process the call. For example, a Web service call might be received that includes a request to create a data repository.

An interface layer 508 in at least one embodiment includes a scalable set of user-facing servers that can provide the various APIs and return the appropriate responses based on the API specifications. The interface layer also can include at least one API service layer that in one embodiment consists of stateless, replicated servers which process the externally-facing user APIs. The interface layer can be responsible for Web service front end features such as authenticating users based on credentials, authorizing the user, throttling user requests to the API servers, validating user input, and marshalling or unmarshalling requests and responses. The API layer also can be responsible for reading and writing database configuration data to/from the administration data store, in response to the API calls. In many embodiments, the Web services layer and/or API service layer will be the only externally visible component, or the only component that is visible to, and accessible by, users of the control service. The servers of the Web services layer can be stateless and scaled horizontally as known in the art. API servers, as well as the persistent data store, can be spread across multiple data centers in a region, for example, such that the servers are resilient to single data center failures.

Figure 6:
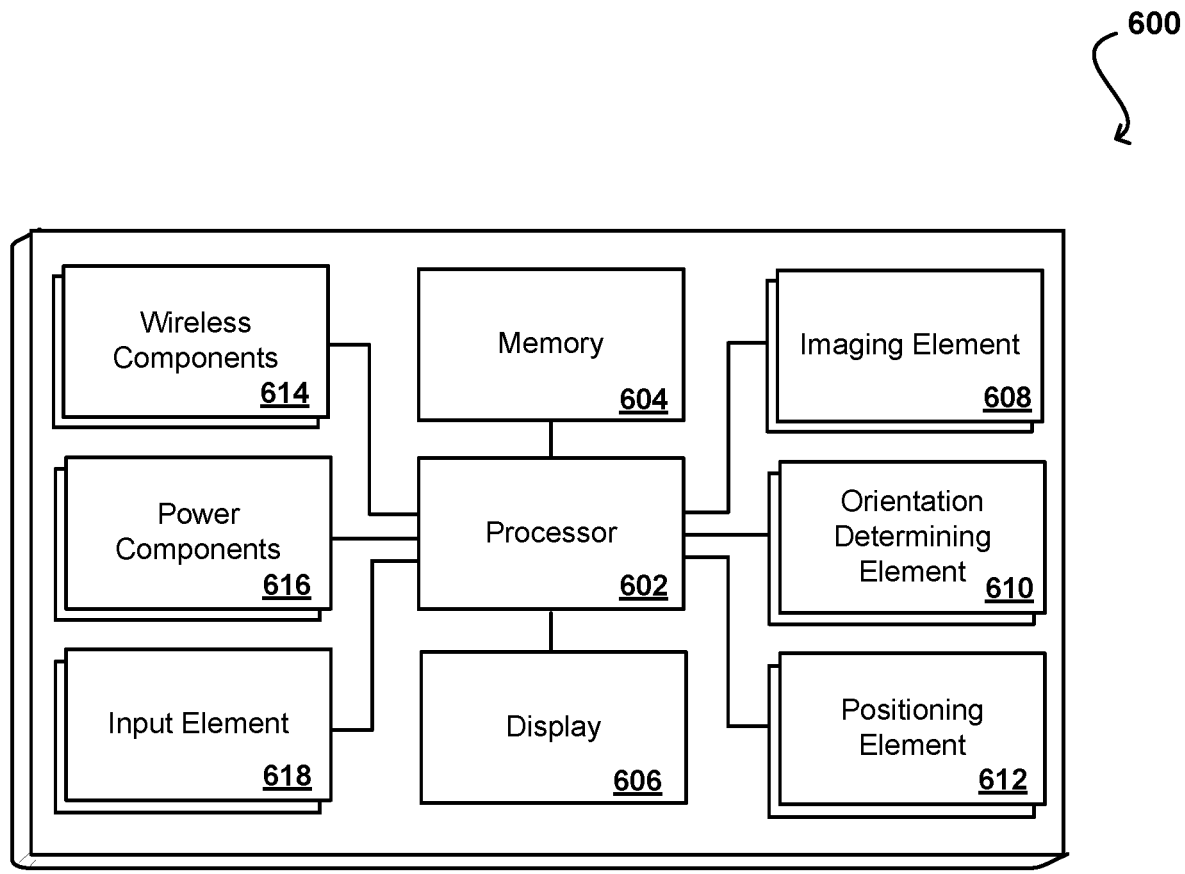
FIG. 6 illustrates example components of a computing device that can be used to implement aspects of the various embodiments.

FIG. 6 illustrates a set of basic components of an electronic computing device 600 that can be utilized to implement aspects of the various embodiments. In this example, the device includes at least one processing unit 602 for executing instructions that can be stored in a memory device or element 604. As would be apparent to one of ordinary skill in the art, the device can include many types of memory, data storage, or computer-readable media, such as a first data storage for program instructions for execution by the processing unit(s) 602, the same or separate storage can be used for images or data, a removable memory can be available for sharing information with other devices, and any number of communication approaches can be available for sharing with other devices. The device typically will include some type of display screen 606, such as a touch screen, electronic ink (e-ink), organic light emitting diode (OLED) or liquid crystal display (LCD), although devices such as portable media players might convey information via other means, such as through audio speakers.

As discussed, the device in many embodiments will include at least one imaging element 608, such as one or more cameras that are able to capture images of the surrounding environment and that are able to image a user, people, or objects in the vicinity of the device. The image capture element can include any appropriate technology, such as a CCD image capture element having a sufficient resolution, focal range, and viewable area to capture an image of the user when the user is operating the device. Methods for capturing images using a camera element with a computing device are well known in the art and will not be discussed herein in detail. It should be understood that image capture can be performed using a single image, multiple images, periodic imaging, continuous image capturing, image streaming, etc. Further, a device can include the ability to start and/or stop image capture, such as when receiving a command from a user, application, or other device.

The example computing device 600 also includes at least one orientation determining element 610 able to determine and/or detect orientation and/or movement of the device. Such an element can include, for example, an accelerometer or gyroscope operable to detect movement (e.g., rotational movement, angular displacement, tilt, position, orientation, motion along a non-linear path, etc.) of the device 600. An orientation determining element can also include an electronic or digital compass, which can indicate a direction (e.g., north or south) in which the device is determined to be pointing (e.g., with respect to a primary axis or other such aspect).

As discussed, the device in many embodiments will include at least a positioning element 612 for determining a location of the device (or the user of the device). A positioning element can include or comprise a GPS or similar location-determining elements operable to determine relative coordinates for a position of the device. As mentioned above, positioning elements may include wireless access points, base stations, etc., that may either broadcast location information or enable triangulation of signals to determine the location of the device. Other positioning elements may include QR codes, barcodes, RFID tags, NFC tags, etc., that enable the device to detect and receive location information or identifiers that enable the device to obtain the location information (e.g., by mapping the identifiers to a corresponding location). Various embodiments can include one or more such elements in any appropriate combination.

As mentioned above, some embodiments use the element(s) to track the location of a device. Upon determining an initial position of a device (e.g., using GPS), the device of some embodiments may keep track of the location of the device by using the element(s), or in some instances, by using the orientation determining element(s) as mentioned above, or a combination thereof. As should be understood, the algorithms or mechanisms used for determining a position and/or orientation can depend at least in part upon the selection of elements available to the device.

The example device also includes one or more wireless components 614 operable to communicate with one or more electronic devices within a communication range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections as known in the art.

The device also includes a power system 616, such as may include a battery operable to be recharged through conventional plug-in approaches, or through other approaches such as capacitive charging through proximity with a power mat or other such device. Various other elements and/or combinations are possible as well within the scope of various embodiments.

In some embodiments the device can include at least one additional input device 618 able to receive conventional input from a user. This conventional input can include, for example, a push button, touch pad, touch screen, wheel, joystick, keyboard, mouse, keypad, or any other such device or element whereby a user can input a command to the device. These I/O devices could even be connected by a wireless infrared or Bluetooth or other link as well in some embodiments. Some devices also can include a microphone or other audio capture element that accepts voice or other audio commands. For example, a device might not include any buttons at all, but might be controlled only through a combination of visual and audio commands, such that a user can control the device without having to be in contact with the device.

In some embodiments, the device can have sufficient processing capability, and the imaging element and associated analytical algorithm(s) may be sensitive enough to distinguish between the motion of the device, motion of a user's head, motion of the user's eyes and other such motions, based on the captured images alone. In other embodiments, such as where it may be desirable for the process to utilize a fairly simple imaging element and analysis approach, it can be desirable to include at least one orientation determining element that is able to determine a current orientation of the device. In one example, the at least one orientation determining element is at least one single- or multi-axis accelerometer that is able to detect factors such as three-dimensional position of the device and the magnitude and direction of movement of the device, as well as vibration, shock, etc. Methods for using elements such as accelerometers to determine movement of a device are also known in the art and will not be discussed herein in detail. Other elements for detecting orientation and/or movement can be used as well within the scope of various embodiments for use as the orientation determining element. When the input from an accelerometer or similar element is used along with the input from the camera, the relative movement can be more accurately interpreted, allowing for a more precise input and/or a less complex image analysis algorithm.

The various embodiments can be further implemented in a wide variety of operating environments, which in some cases can include one or more user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C # or C++ or any scripting language, such as Perl, Python or TCL, as well as combinations thereof. The server(s) may also include database servers, including without limitation those commercially available from Oracle®, Microsoft®, Sybase® and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, magnetic tape drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computer-implemented method, comprising:
    dividing a memory space for storing data in a dynamic random-access memory (DRAM) device into a plurality of sub-spaces;
    selecting a respective starting address for each sub-space;
    identifying a set of testing addresses that are within up to three Hamming distances of a respective starting address;
    writing a testing pattern to a first subset of the testing addresses;
    reading, after the writing, stored data from a second subset of the testing addresses;
    comparing the stored data against the test pattern, differences between the stored data and the test pattern being indicative of an error in the DRAM device; and
    causing a remedial action to be taken in response to more than a threshold number of differences being detected for the DRAM device.

2. The computer-implemented method of claim 1, further comprising:
    selecting the test pattern based upon a topology of the DRAM device, the test pattern selected to provide stress on address lines and data lines of the DRAM device.

3. The computer-implemented method of claim 1, further comprising:
    starting with a Hamming distance of 1 and increasing by integer increments to identify the testing addresses until either all testing addresses that are within up to three Hamming distances of a respective starting address are identified or a maximum number of testing addresses is reached.

4. The computer-implemented method of claim 1, further comprising:
    analyzing data from an error-correcting code (ECC) circuit for the DRAM device to identify single bit errors stored on the DRAM device.

5. A computer-implemented method, comprising:
    selecting a starting address for testing a memory device;
    identifying testing addresses within a Hamming distance of the starting address;
    writing a testing pattern to a first subset of the testing addresses of the memory device;
    reading, after the writing, data stored by a second subset of the testing addresses of the memory device; and
    identifying an error present in the memory device corresponding to a difference detected between the data stored by the testing addresses and the testing pattern.

6. The computer-implemented method of claim 5, further comprising:
    incrementing the Hamming distance used for identifying the testing addresses until a maximum Hamming distance is reached or a maximum number of testing addresses are identified.

7. The computer-implemented method of claim 5, further comprising:
    identifying a region of the memory device for testing based upon determining a suspected storage issue on the memory device.

8. The computer-implemented method of claim 5, further comprising:
    dividing a memory space of the memory device into a number of subspaces capable of being concurrently tested by a number of available testing components.

9. The computer-implemented method of claim 8, wherein the available testing components include at least one of a computer processor, a processor core, a direct memory access (DMA) device, a memory controller, or a staggered pin grid array (SPGA) device.

10. The computer-implemented method of claim 5, wherein the memory device is a dynamic random-access memory (DRAM) device.

11. The computer-implemented method of claim 5, further comprising:
    selecting the test pattern based upon a topology of the memory device, the test pattern selected to provide stress on address lines and data lines of the memory device.

12. The computer-implemented method of claim 5, further comprising:
    analyzing data from an error-correcting code (ECC) circuit for the memory device to identify single bit errors stored to the memory device.

13. The computer-implemented method of claim 5, wherein the testing pattern includes at least one of a 0x5555, 0xaaaa, walking ones, or walking zeroes pattern.

14. The computer-implemented method of claim 5, further comprising:
    identifying data pattern testing for the memory device based upon the Hamming distance.

15. The computer-implemented method of claim 5, further comprising:
    causing a remedial action to be taken in response to more than a threshold number of errors being detected for the memory device.

16. A system, comprising:
    at least one processor; and
    memory including instructions that, when executed by the at least one processor, cause the system to:
        determine a starting address for testing a memory device;
        identify testing addresses within a Hamming distance of the starting address;
        write a testing pattern to at least a first subset of the testing addresses of the memory device;
        read, after the writing, data stored by at least a second subset of the testing addresses of the memory device; and identify an error present in the memory device corresponding to a difference detected between the data stored by the testing addresses and the testing pattern.

17. The system of claim 16, wherein the instructions when executed further cause the system to:
   increment the Hamming distance used for identifying the testing addresses until a maximum Hamming distance is reached or a maximum number of testing addresses are identified.

18. The system of claim 16, wherein the instructions when executed further cause the system to:
   divide a memory space of the memory device into a number of subspaces capable of being concurrently tested by a number of available testing components.

19. The system of claim 18, wherein the available testing components include at least one of a computer processor, a processor core, a direct memory access (DMA) device, a memory controller, or a staggered pin grid array (SPGA) device.

20. The system of claim 16, wherein the memory device is a dynamic random-access memory (DRAM) device, and wherein the test pattern is selected to provide stress on address lines and data lines of the DRAM device.

* * * * *